United States Patent
Al-Sa'di et al.

(10) Patent No.: US 10,825,900 B2
(45) Date of Patent: Nov. 3, 2020

(54) SEMICONDUCTOR SWITCH DEVICE AND METHOD HAVING AT LEAST TWO CONTACTS LOCATED ON EITHER THE SOURCE REGION OR THE DRAIN REGION

(71) Applicant: NXP B.V., Eindhoven (NL)

(72) Inventors: Mahmoud Shehab Mohammad Al-Sa'di, Kranenburg (DE); Petrus Hubertus Cornelis Magnee, Malden (NL); Ihor Brunets, Kleve (DE); Jan Willem Slotboom, Eersel (NL); Tony Vanhoucke, Bierbeek (BE)

(73) Assignee: NXP B.V., Eindhoven (NL)

( * ) Notice: Subject to any disclaimer, the term of this patent is extended or adjusted under 35 U.S.C. 154(b) by 90 days.

(21) Appl. No.: 16/002,841

(22) Filed: Jun. 7, 2018

(65) Prior Publication Data
US 2019/0019867 A1    Jan. 17, 2019

(30) Foreign Application Priority Data
Jul. 12, 2017    (EP) .................................... 17180985

(51) Int. Cl.
*H01L 29/10*    (2006.01)
*H01L 29/06*    (2006.01)
(Continued)

(52) U.S. Cl.
CPC .... *H01L 29/1087* (2013.01); *H01L 21/76227* (2013.01); *H01L 21/823437* (2013.01);
(Continued)

(58) Field of Classification Search
CPC ............. H01L 29/1087; H01L 29/0653; H01L 29/41758; H01L 29/7835; H01L 29/0692;
(Continued)

(56) References Cited

U.S. PATENT DOCUMENTS 6,420,770 B1    7/2002 Xiang et al.
6,509,232 B1    1/2003 Kim et al.
(Continued)

FOREIGN PATENT DOCUMENTS

JP    2004221441 A    8/2004

OTHER PUBLICATIONS

European Application No. Not Yet Published; 21 pages (Feb. 2, 2017).
(Continued)

*Primary Examiner* — Nelson Garces

(57) ABSTRACT

A semiconductor switch device and a method of making the same. The device includes a semiconductor substrate having a major surface. The device also includes a first semiconductor region located in the substrate beneath the major surface. The device includes an elongate gate located on the major surface. The device also includes a source region and a drain region located in the first semiconductor region adjacent respective first and second elongate edges of the gate. The device also includes electrical contacts for the source and drain regions. The contacts include at least two contacts located on either the source region or the drain region, which are spaced apart along a direction substantially parallel the elongate edges of the gate. The device further includes an isolation region located between the at least two contacts. The isolation region extends through the source/drain region from the major surface to the first semiconductor region.

17 Claims, 6 Drawing Sheets

(51) Int. Cl.
*H01L 29/78* (2006.01)
*H01L 29/417* (2006.01)
*H01L 21/762* (2006.01)
*H01L 21/8234* (2006.01)
*H01L 29/08* (2006.01)

(52) U.S. Cl.
CPC ...... *H01L 29/0649* (2013.01); *H01L 29/0653* (2013.01); *H01L 29/0692* (2013.01); *H01L 29/0847* (2013.01); *H01L 29/41758* (2013.01); *H01L 29/7801* (2013.01); *H01L 29/7833* (2013.01); *H01L 29/7835* (2013.01)

(58) Field of Classification Search
CPC ............................ H01L 29/0843–0891; H01L 29/66636–66643; H01L 21/823418–823425; H01L 21/823814; H01L 21/76224–76237; H01L 21/823481; H01L 21/823878; H01L 29/66696; H01L 29/66727; H01L 29/41741; H01L 29/4238
See application file for complete search history.

(56) References Cited

U.S. PATENT DOCUMENTS

| | | |
|---|---|---|
| 2010/0096697 A1 | 4/2010 | Su et al. |
| 2012/0098062 A1* | 4/2012 | Pendharkar ......... H01L 29/0653 257/337 |
| 2016/0240662 A1* | 8/2016 | Park ..................... H01L 21/761 |
| 2017/0221994 A1 | 8/2017 | Al-Sa'di et al. |

OTHER PUBLICATIONS

European application No. 17171514.7; Not yet Published; 23 pages (May 17, 2017).

* cited by examiner

SEMICONDUCTOR SWITCH DEVICE AND METHOD HAVING AT LEAST TWO CONTACTS LOCATED ON EITHER THE SOURCE REGION OR THE DRAIN REGION

CROSS-REFERENCE TO RELATED APPLICATIONS

This application claims the priority under 35 U.S.C. § 119 of European patent application no. 17180985.8, filed Jul. 12, 2017 the contents of which are incorporated by reference herein.

BACKGROUND

The present specification relates to a semiconductor switch device and to a method of making a semiconductor switch device.

Metal Oxide Semiconductor Field Effect Transistors (MOSFETs) can be used as electric switches for high Radio Frequency (RF) signals. For these applications the device does not actually switch at high frequencies, rather it passes or blocks RF signals. Best performance is achieved with a device that combines low series resistance in on-state with low input capacitance in off-state. One of the most popular ways to evaluate the overall performance of an RF Switch MOSFET is to calculate a figure of merit (FOM), which is defined as the product of the on-state resistance ($R_{on}$) and the off-state capacitance ($C_{off}$).

Contributions to the off-state capacitance are the gate-to-source ($C_{gs}$), gate-to-drain ($C_{gd}$), gate-to-substrate ($C_{gb}$), drain-to-substrate ($C_{db}$), and source-to-substrate ($C_{sb}$) capacitance as shown in the following formulas:

$$C_{off} = \left(\frac{1}{C_{dd}-C_{ds}} + \frac{1}{C_{ss}-C_{ds}}\right)^{-1} + C_{ds} = \left(\frac{C_{dg}*C_{gs}}{C_{dg}+C_{gs}}\right) + \left(\frac{C_{db}*C_{sb}}{C_{db}+C_{sb}}\right) + C_{ds}$$

$$C_{ss} = C_{ds} + C_{gs} + C_{sb}$$

$$C_{dd} = C_{ds} + C_{gd} + C_{db}$$

Here, $C_{ds}$ is the channel capacitance, and $C_{sb}$, $C_{db}$ are the source to bulk, drain to bulk capacitances, respectively. The overlap capacitance ($C_{gs}=C_{gd}$) and parasitic junction capacitances ($C_{db}=C_{sb}$) are of great importance as they constitute both significant fractions of the total off-state capacitance ($C_{off}$). Therefore, to achieve low $C_{off}$, it is desirable to reduce the overlap capacitance and/or the parasitic junction capacitances.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor switch device comprising:
a semiconductor substrate having a major surface;
a first semiconductor region located in the substrate beneath the major surface, the first semiconductor region having a first conductivity type;
an elongate gate located on the major surface;
a source region having a second conductivity type, wherein the source region is located in the first semiconductor region adjacent a first elongate edge of the gate;
a drain region having the second conductivity type, wherein the drain region is located in the first semiconductor region adjacent a second elongate edge of the gate;
electrical contacts for forming electrical connections to the source region and the drain region, wherein the electrical contacts include at least two contacts located on either the source region or the drain region, wherein said at least two contacts are spaced apart along a direction substantially parallel the elongate edges of the gate, and
an isolation region located between said at least two contacts when viewed from above the major surface of the substrate, wherein the isolation region extends through the source/drain region from the major surface to the first semiconductor region.

The parasitic junction capacitance of a semiconductor device that includes a source region and a drain region separated by a gate is proportional to the surface area of the interfaces between the source region and drain region and the underlying substrate. By providing isolation regions in the device, which extend through the source/drain regions from the major surface to the first semiconductor region, the surface area of the interface(s) between the source/drain regions and the first semiconductor region may be reduced. The parasitic junction capacitance and accordingly the overall off-state capacitance ($C_{off}$) of the device may therefore be reduced.

To accommodate the isolation regions, instead of providing a monolithic contact in the source/drain regions, a series of smaller, separate contacts are used. The isolation regions are located in between these contacts.

According to embodiments of this disclosure, it has been determined that it is possible to provide the aforementioned isolation regions while avoiding a significant increase in the on-state resistance ($R_{on}$) of the device associated with the smaller size of the contacts (i.e. compared to known devices which include a monolithic source/drain contact but no isolation regions). Careful configuration of the layout of the device (and in particular of the location and dimensions of the isolation regions in relation to the contacts) may allow the spreading of currents passing between the contacts and the gate to result in a device that has the same or nearly the same on-state resistance ($R_{on}$) of a device having monolithic source/drain contacts.

In this way, the off-state capacitance ($C_{off}$) of the device may be reduced without adversely affecting the on-state resistance ($R_{on}$).

In one embodiment, an edge of each contact located closest the gate may be located a distance $L_c$ from the gate, and an edge of the isolation region located closest the gate may be located a distance $D_{ir}$ from the gate. In some embodiments, $L_c \leq D_{ir}$. This arrangement may allow the isolation regions to be provided to reduce parasitic capacitance as noted above, while reducing or eliminating their tendency to unduly restrict the spreading out of currents flowing between the contacts and the gate.

In some embodiments, $L_c<D_{ir}$. In such embodiments, a dimension $W_{ir}$ of the isolation region in a direction substantially parallel the elongate edges of the gate may be substantially equal to the spacing between the contacts in the same direction, so that the isolation region extends from an edge of a first of the contacts to an opposing edge of a second of the contacts when viewed from above the major surface. In such embodiments, the size of the isolation region may be maximised (in terms of its dimension $W_{ir}$ between the contacts) while leaving at least part of the opposing edges of each contact free for the passing of current. Since the isolation regions are "recessed" (in the sense that they are located further away from the gate than the contacts, they may not interfere with the current spreading effect noted above, notwithstanding the fact that they extend all the way between the opposing edges of the contacts.

In some embodiments, a dimension $W_{ir}$ of the isolation region in a direction substantially parallel the elongate edges of the gate may be less than the spacing between the contacts in the same direction. Because the isolation regions do not extend all the way between neighbouring contacts in such embodiments, more space is made available between the contacts for current spreading.

The device may have more than two contacts on the source region and/or the drain region. For instance, a device according to an embodiment of this disclosure may have at least three contacts located on the source region and/or at least three said contacts located on the drain region, and an isolation region may be located between each pair of neighbouring contacts. Accordingly, the device may be scaled conveniently, while retaining the benefit of a reduced off-state capacitance $C_{off}$ without a significant increase in $R_{on}$ as discussed above.

Isolation regions of the kind described herein may also be located in the source/drain regions in locations other than between the contacts. In one embodiment, the device may include at least one isolation region located at an end of a row of contacts in the source/drain region. This may further reduce the parasitic junction capacitance of the device.

In one embodiment, the electrical contacts may include at least two contacts located on the source region and at least two contacts located on the drain region. The at least two contacts on the source region may be spaced apart along a direction substantially parallel the elongate edges of the gate. The at least two contacts on the drain region may be spaced apart along a direction substantially parallel the elongate edges of the gate. The device may include an isolation region located between the at least two contacts on the source region and an isolation region located between the at least two contacts on the drain region when viewed from above the major surface of the substrate. Each isolation region may extend through the source/drain region from the major surface to the first semiconductor region. Accordingly, the arrangement of contacts and isolation regions of the kind described herein may be used to reduce parasitic junction capacitance associated with both the source region and the drain region of the device.

In some embodiments, the spacing between the contacts on the source region may be substantially equal to the spacing between the contacts on the drain region. The contacts on the drain region may be offset with respect to the contacts on the source region in a direction parallel to the elongate edges of the gate. The offset may be substantially equal to half the spacing between the contacts on the source region. Offsetting the contacts in this way can allow the backend parasitic capacitance between the electrical connections to these contacts to be reduced.

In some embodiments, the spacing between the contacts on the source region is different to the spacing between the contacts on the drain region. Again, this can allow the backend parasitic capacitance between the electrical connections to these contacts to be reduced.

In some embodiments, the size of the isolation regions and the contacts on either the source and/or drain regions may be different. For instance, it is envisaged that different sized contacts and/or isolation regions may be used in the source region. It is also envisaged that different sized contacts and/or isolation regions may be used in the drain region. It is further envisaged that the contacts and/or isolation regions used in the source region may be of a different size (or sizes) to the contacts and/or isolation regions used in the drain region.

In some examples, the device may have a plurality of source and/or drain regions arranged as an array of interdigitated fingers.

The or each isolation region may extend to a greater depth beneath the major surface of the substrate than the source/drain region in which that isolation region is located. This may ensure that the isolation region(s) pass fully through the interface between the source/drain regions and the underlying first semiconductor region, thereby to ensure that the surface area of the interface is reduced for reducing the parasitic junction capacitance of the device.

The or each isolation region may include a trench filled with dielectric material. In some examples, the isolation regions may comprise Shallow Trench Isolation (STI).

The first conductivity type may be p-type and the second conductivity type may be n-type. However, it is envisaged that the first conductivity type may be n-type and the second conductivity type may be p-type.

The first semiconductor region may be a doped epitaxial layer. The doped epitaxial layer may be provided as an upper layer on a Silicon-on-Insulator (SOI) substrate. In another example, the doped epitaxial layer may be provided on an underlying bulk semiconductor (e.g. silicon) substrate.

A device of the kind described herein may be an RF switch device, for switching an RF signal. For the purposes of this disclosure "Radio Frequency" (RF) refers to frequencies typically in the range of, but not limited to 0.5 GHz≤f≤90 GHz. Note that although a semiconductor switch device according to embodiments of this disclosure may be used to pass or block an RF signal, typically the device would not actually switch at the RF frequency itself.

According to another aspect of the present disclosure, there is provided a method of making a semiconductor switch device, the method comprising:

providing a semiconductor substrate having a major surface and a first semiconductor region located in the substrate beneath the major surface, the first semiconductor region having a first conductivity type;

depositing and patterning a gate dielectric and a gate electrode material to form an elongate gate on the major surface;

forming a source region having a second conductivity type, wherein the source region is located in the first semiconductor region adjacent a first elongate edge of the gate;

forming a drain region having the second conductivity type, wherein the drain region is located in the first semiconductor region adjacent a second elongate edge of the gate;

forming an isolation region that extends through the source or the drain region from the major surface to the first semiconductor region, and depositing electrical contacts for forming electrical connections to the source region and the drain region, wherein the electrical contacts include at least two contacts located on either the source region or the drain region, wherein said at least two contacts are spaced apart along a direction substantially parallel the elongate edges of the gate, and wherein the isolation region is located between said at least two contacts when viewed from above the major surface of the substrate.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
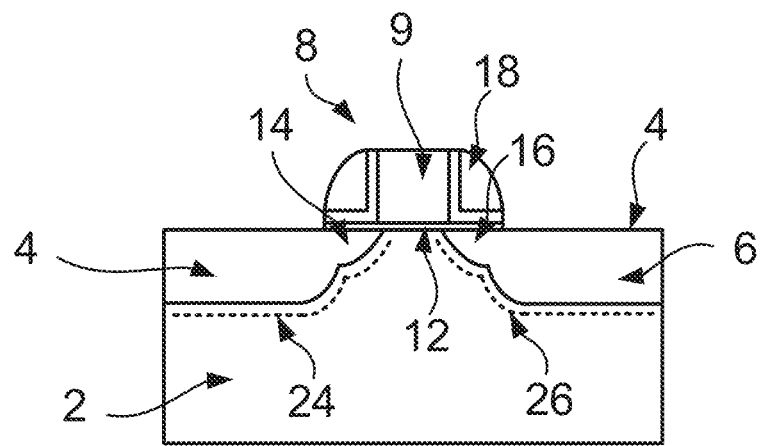
FIG. 1 shows an example of a semiconductor device including a source region, a gate and a drain region.

FIG. 1 shows an example of a semiconductor switch device. The device includes a semiconductor substrate. The substrate may, for example, comprise silicon. The substrate may be a bulk substrate, but it is also envisaged that the substrate may comprise a silicon-on-insulator (SOI) type substrate comprising a layer of silicon epitaxially grown on an underlying insulating layer.

The substrate has a major surface 10. Further features of the device are formed on the major surface 10 and in a first semiconductor region 2 of the device located beneath the major surface 10. The first semiconductor region 2 is doped to have a first conductivity type (n-type or p-type conductivity).

A source region 4 and a drain region 6 are located in the first semiconductor region adjacent the major surface 10. The source region 4 and drain region 6 are each provided with respective electrical contacts located on the major surface 10 (not shown in FIG. 1). The source region 4 and the drain region 6 each have a second conductivity type, which is different to the first conductivity type (p-type or n-type conductivity). In the present example, the device comprises an NMOS switch device, in which the first conductivity type is p-type and the second conductivity type is n-type. However, it is envisaged that the device may be a PMOS switch device, in which the first conductivity type is n-type and the second conductivity type is p-type. The source region 4 and the drain region 6 may each be more highly doped than the first semiconductor region 2.

The device also includes a gate 8 located on the major surface 10. The gate 8 is shown in cross section in FIG. 1, but is generally elongate and extends along the major surface 10. The source region 4 is located adjacent to and runs generally parallel to a first elongate edge of the gate 8. The drain region 6 is located adjacent to and runs generally parallel to a second elongate edge of the gate 8.

The gate 8 includes a gate dielectric 12 such as an oxide layer located on the major surface between the source region 4 and the drain region 6. The gate 8 also includes a gate electrode 9 located on the gate dielectric 12. The gate electrode 9 may comprise, for example, polysilicon. The gate 8 also includes spacers 18 located on either side of the gate electrode 9. As is known in the art, the source region 4 and drain region 6 may have lightly doped regions 14, 16 which extend beneath the spacers 18.

For simplicity, FIG. 1 shows a single finger NMOS switch device, but it will be appreciated that the device may instead have a plurality of fingers. The device may, for instance, be a radio frequency (RF) switch device.

In this kind of device, the parasitic junction capacitances associated with the source region 4 ($C_{sb}$) and the drain region 6 ($C_{db}$) scale with the area of the pn junctions formed at the interfaces between the source region 4 and drain region 6 and the first semiconductor region 2. These areas are indicated schematically in FIG. 1 by the dotted lines labelled 24 and 26. Because of this, for a given n+ doping level in the source region 4 and drain region 6, and for a given p doping level in the first semiconductor region 2, larger junction areas result in larger junction capacitances $C_{sb}$, $C_{db}$.

Figure 2:
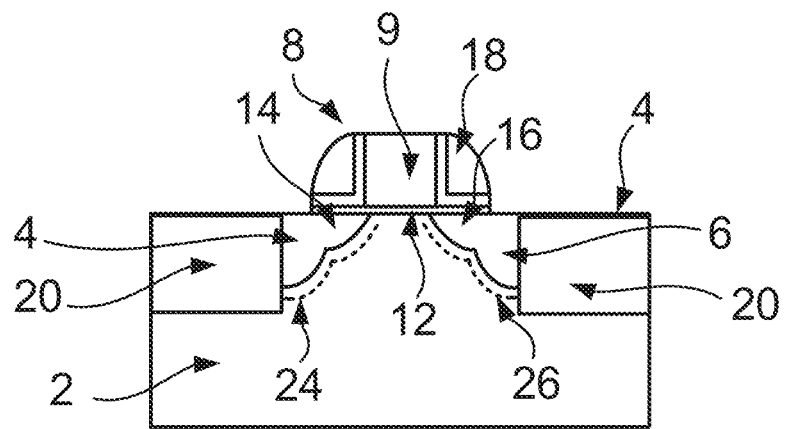
FIG. 2 shows an example of a semiconductor switch device according to an embodiment of the present disclosure.

FIG. 2 shows an example of a semiconductor switch device according to an embodiment of the present disclosure. The device includes a semiconductor substrate. The substrate may, for example, comprise silicon. As with the example of FIG. 1, the substrate may be a bulk substrate, but it is also envisaged that the substrate may comprise a silicon-on-insulator (SOI) type substrate comprising a layer of silicon epitaxially grown on an underlying insulating layer.

The substrate has a major surface 10. As with the example of FIG. 1, further features of the device may be formed on the major surface 10 and in a first semiconductor region 2 of the device located beneath the major surface 10. The first semiconductor region may be a doped epitaxial layer. The doped epitaxial layer may be provided as an upper layer on a Silicon-on-Insulator (SOI) substrate. In another example, the doped epitaxial layer may be provided on an underlying bulk semiconductor (e.g. silicon) substrate. The first semiconductor region 2 may be doped to have a first conductivity type (either n-type or p-type conductivity).

A source region 4 and a drain region 6 are located in the first semiconductor region adjacent the major surface 10. The source region 4 and/or drain region 6 may each provided with a plurality of electrical electrical contacts located on the major surface 10 (not shown in FIG. 2). The configuration of these contacts with be described in more detail below. The source region 4 and the drain region 6 each have a second conductivity type, which is different to the first conductivity type (p-type or n-type conductivity). In the present embodiment, the device comprises an NMOS switch device, in which the first conductivity type is p-type and the second conductivity type is n-type. However, it is envisaged that the device may be a PMOS switch device, in which the first conductivity type is n-type and the second conductivity type is p-type. The source region 4 and the drain region 6 may each be more highly doped than the first semiconductor region 2. The source region 4 and the drain region 6 may, for instance, be formed using ion implantation techniques as is known in the art of semiconductor device manufacture.

The device also includes a gate 8 located on the major surface 10. The gate 8 is shown in cross section in FIG. 2, but may be generally elongate and may extend along the major surface 10. The source region 4 is located adjacent to and may run generally parallel to a first elongate edge of the gate 8. The drain region 6 is located adjacent to and may run generally parallel to a second elongate edge of the gate 8.

The gate 8 may include a gate dielectric 12 such as an oxide layer located on the major surface between the source region 4 and the drain region 6. The gate 8 may also include a gate electrode 9 located on the gate dielectric 12. The gate electrode 9 may comprise, for example, polysilicon. The gate 8 may further include spacers 18 located on either side of the gate electrode 9. In some embodiments, the source region 4 and drain region 6 may have lightly doped regions 14, 16 which extend beneath the spacers 18. The gate 8 may be formed by depositing a dielectric layer on the major surface 10 and then gate electrode material on the dielectric layer to form the gate dielectric 12 and gate electrode 9. The spacers 18 may then deposited on either side of the gate electrode 9. Typically the source region 4 and the drain region 6 may be formed using ion implantation into the first semiconductor region 2 after formation of the gate 8.

For simplicity, FIG. 2 shows a single finger NMOS switch device, but it will be appreciated that the device may instead have a plurality of fingers. An example of a device having a multiple finger will be described in more detail below in relation to FIGS. 9 and 10. The device may, for instance, be a radio frequency (RF) switch device for switching an RF signal. For the purposes of this disclosure "Radio Frequency" (RF) refers to frequencies typically in the range of, but not limited to $0.5\text{ GHz} \leq f \leq 90\text{ GHz}$. Note that although a semiconductor switch device according to embodiments of this disclosure may be used to pass or block an RF signal, typically the device would not actually switch at the RF frequency itself.

In accordance with an embodiment of this disclosure, one or more isolation regions 20 are provided in the source region 4 and/or in the drain region 6. As will be described below, these isolation regions 20 may be located between the electrical contacts of the source region 4 and/or the drain region 6 when viewed from above the major surface 10 of the substrate. As shown in the cross section view of FIG. 2, each isolation region 20 extends through the source region 4 or drain region 6 from the major surface 10 to the first semiconductor region 2. In some embodiments, each isolation region 20 may extend to a greater depth beneath the major surface 10 of the substrate than the source/drain regions 4, 6 in which that isolation region 20 is located. This may ensure that the isolation region(s) 20 pass fully through the interface between the source/drain regions 4, 6 and the underlying first semiconductor region 2. Each isolation region 20 may, for instance, comprise a trench filled with dielectric material. During manufacture, the trench(es) may be etched into the major surface 10 (either before or after the formation of the source regions 4 and drain region 6) and then a dielectric may be deposited into the trench(es). In some embodiments, the isolation regions 20 may comprise shallow trench isolation (STI) as known in the art of semiconductor device manufacturing.

As will be described in more detail below, the isolation regions may take the form of islands when viewed from above the major surface 10 of the semiconductor substrate. The introduction of these isolation regions 20 may reduce the area of the pn junctions formed at the interfaces between the source region 4 and drain region 6 and the first semiconductor region 2 (compare the dotted lines 24, 26 with those shown in FIG. 1). This may reduce the parasitic junction capacitances associated with the source region 4 ($C_{sb}$) and the drain region 6 ($C_{db}$). In turn, this may lead to a reduction in the overall off-state capacitance ($C_{off}$) of the device.

Figure 3:
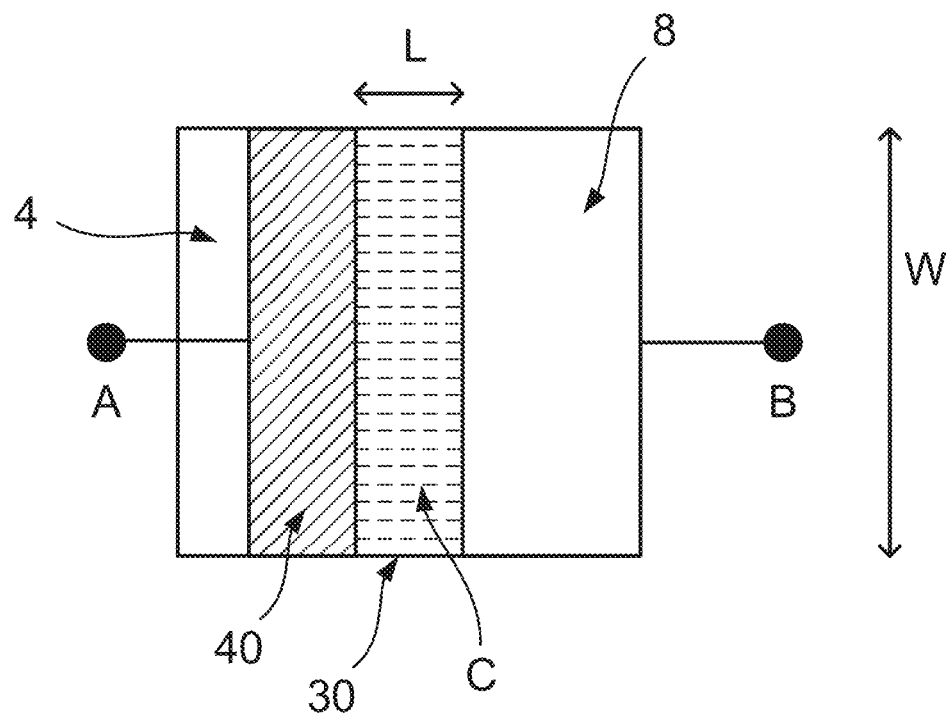
FIG. 3 shows an example of the current flow in a semiconductor device including a source region, a gate and a drain region, in which the source is provided with a single monolithic contact.

FIG. 3 shows the source side of the device of FIG. 1 viewed from above the major surface 10 of the semiconductor substrate. In a semiconductor switch device of the kind shown in FIGS. 1 and 3, the contact 40 of the source region 4 (and the drain region 6) is provided as a monolithic elongate stripe which extends parallel to, and has the same width as the elongate gate 8. In this case, in the on-state, current flows in the source region 4 linearly between the contact 40 and the gate 8 as represented by the dotted lines labelled C in FIG. 3. The total resistance between points A and B in FIG. 3 is given by $R_{AB} = \rho \cdot L/W$, where W is the device gate width, L is the distance between the source contact 40 and the gate 8 and $\rho$ is the resistivity of the source region material.

Figure 4:
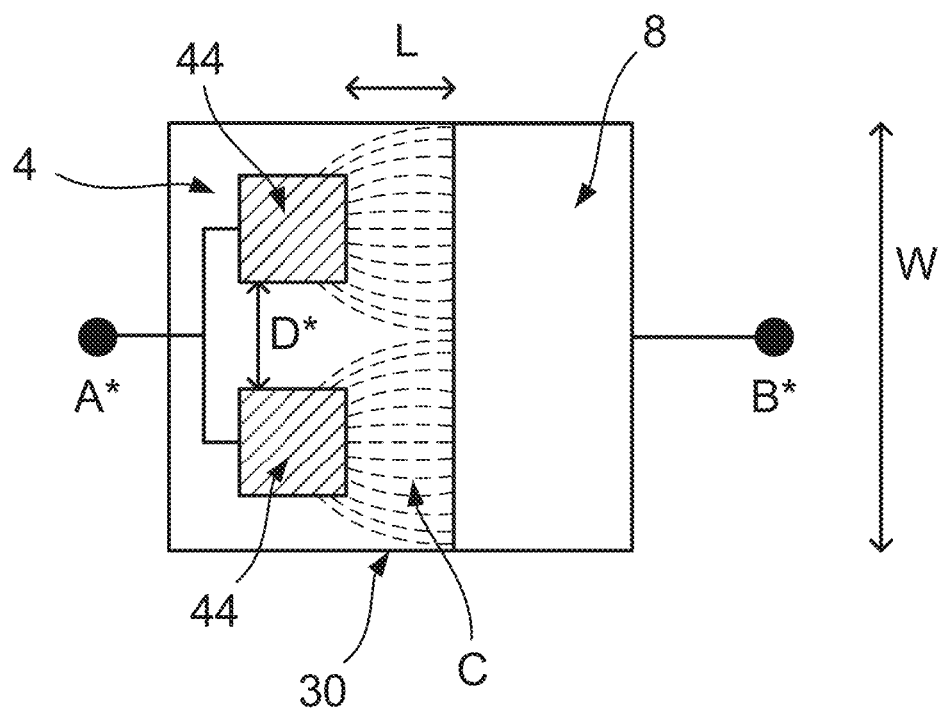
FIG. 4 shows an example of the current flow in a semiconductor device including a source region, a gate and a drain region, in which the source is provided with a plurality of separate contacts.

In order to accommodate the isolation regions 20 shown in FIG. 2, in accordance with an embodiment of this disclosure, instead of providing a monolithic contact 40 in the source/drain regions as shown in FIG. 4, a series of smaller, separate electrical contacts 44 may be used, as shown in FIG. 4. The contacts 44 may be separated by a distance D along a direction parallel to the elongate edges of the gate 8. These contacts 44 may be electrically connected together as shown schematically in FIG. 4. The contacts 44 may be metallic. Although FIG. 4 shows the contacts 44 as being provided on the source region 4 of the device, it is envisaged that the multiple separate contacts of this kind may be provided on the drain region 6 instead, or indeed on both the source region 4 and the drain region 6 with similar benefits to those described herein.

In principal, the reduction in overall size of the contacts 44 compared to the use of a monolithic contact 40 of the kind shown in FIG. 3 may lead to an increase in the on-state resistance ($R_{on}$) of the device. However, it is envisaged that this may be partly or even completely mitigated by the current spreading effect. In accordance with this effect, current flowing between the contacts 44 and the gate 8 (represented by the dotted lines labelled C in FIG. 4) tends to spread out as it approaches the gate 8. Due to this two-dimensional current spreading principle, the total resistance $R_{A*B*}$ between source contacts 44 and gate 8 may approach, or even be equal to the one-dimensional resistance $R_{AB}$ mentioned above in relation to FIG. 3, depending on the distance between the contacts. The optimum contact size and spacing D* may depend on several parameters such as device geometry, the sheet resistance of the source/drain silicide, the contact resistance between silicide and N+ regions and sheet resistance of the N+ regions.

Figure 5:
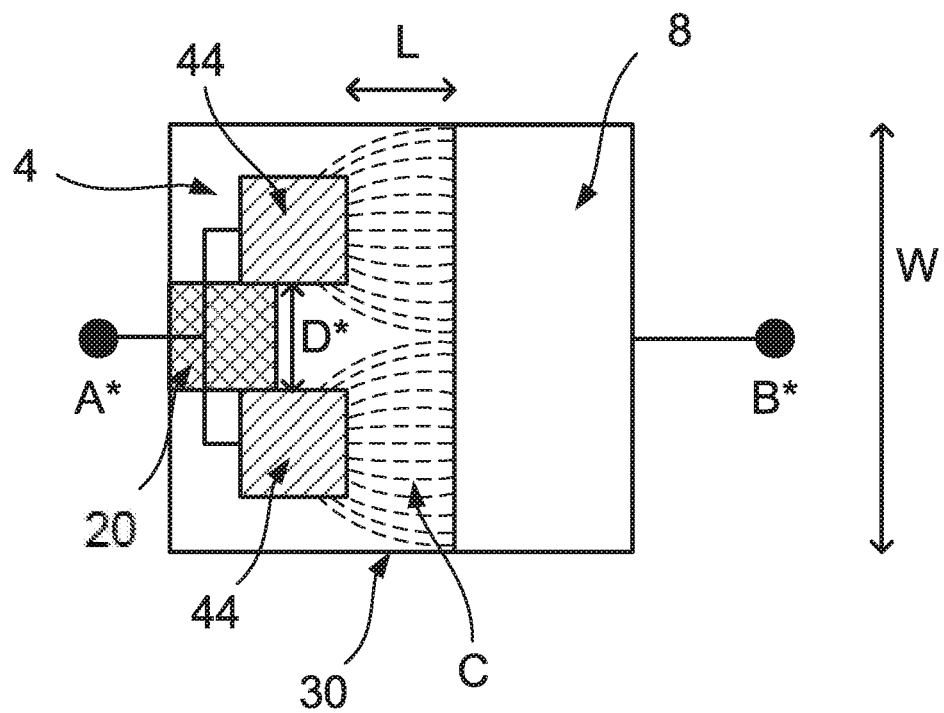
FIG. 5 shows an example of a semiconductor switch device according to an embodiment of the present disclosure.
Figure 6:
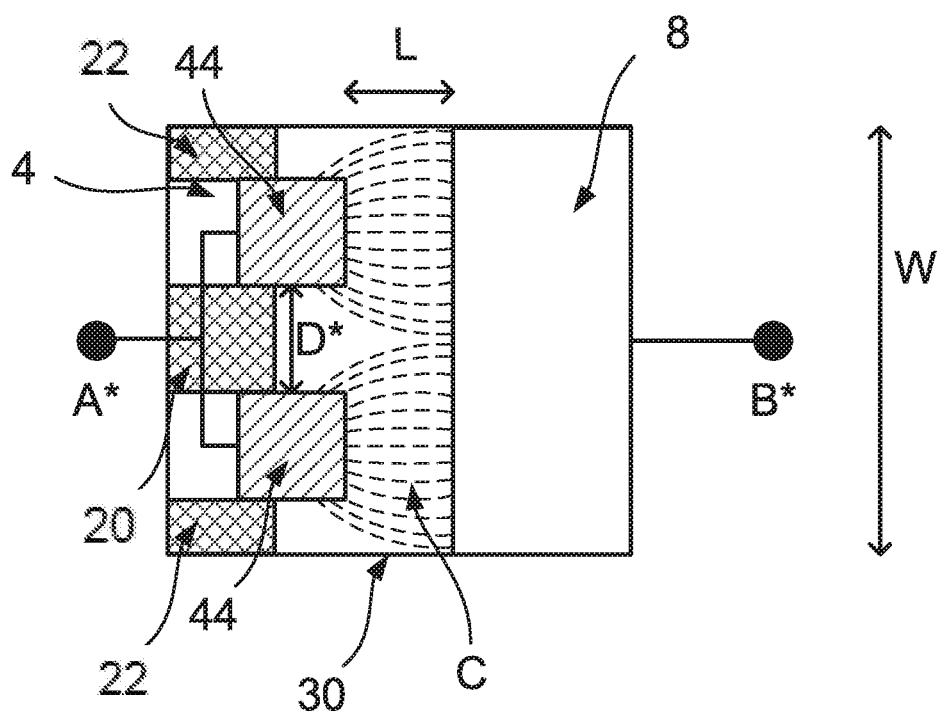
FIG. 6 shows an example of a semiconductor switch device according to an embodiment of the present disclosure.

FIG. 5 shows the source side of the device of FIG. 2 viewed from above the major surface 10 of the semiconductor substrate. As described above, to accommodate the isolation regions 20, instead of providing a monolithic contact on the source/drain regions 4, 6, a series of smaller, separate contacts 44 are used. The isolation region(s) 20 may be located in between these contacts 44. As shown in FIG. 6, it is also envisaged that in addition to the provision of isolation region(s) 20 being located between neighbouring contacts 44, further isolation regions 22 may be provided at either end of a row of such contacts 44 on the source/drain regions 4, 6. Again, although FIGS. 5 and 6 show the contacts 44 and isolation region(s) 20, 22 being provided on the source region 4 of the device, it is envisaged that these may instead be provided on the drain region 6, or indeed on both the source region 4 and the drain region 6, with similar benefits to those described herein.

Figure 7:
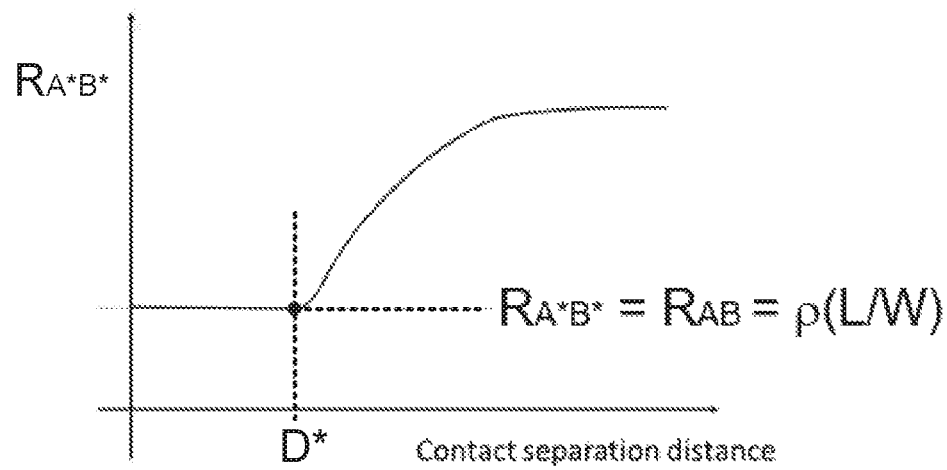
FIG. 7 illustrates the effect of current spreading on the on-state resistance of a device of the kind shown in FIG. 6.

The dependence of the two-dimensional spreading resistance $R_{A*B*}$ on the distance D between the contacts 44 of the device of FIG. 6 is shown schematically in FIG. 7. A similar dependency of $R_{A*B*}$ on the distance D exists for a device of the kind of device shown in FIG. 5. From FIG. 7 it is clear that when keeping the distance between the contacts 44 sufficiently small (smaller than optimum distance D*), the two-dimensional spreading resistance $R_{A*B*}$ equals its one-dimensional counterpart $R_{AB}=\rho \cdot L/W$ described above in relation to FIG. 3. This means that a significant part of the area between the contacts in FIG. 6 is not required for the current to flow (and does not contribute to $R_{on}$) and may therefore be used to accommodate the isolation region(s) 20. In this way, the isolation regions 20, 22 may allow the parasitic junction capacitances $C_{sb}$, $C_{db}$ of the device to be reduced for reducing the total off-state capacitance $C_{off}$, without necessarily having an adverse effect on the on-state resistance ($R_{on}$) of the device.

While the current spreading effect is described here in the context of a two-dimensional situation, it is noted that in general the current spreading may also take place in the third dimension (i.e. along the direction parallel to the surface normal of the major surface 10). This additional spreading would further reduce the on-state resistance while allowing the introduction of the isolation regions 20, 22 for reducing the parasitic junction capacitances $C_{sb}$, $C_{db}$.

Figure 8:
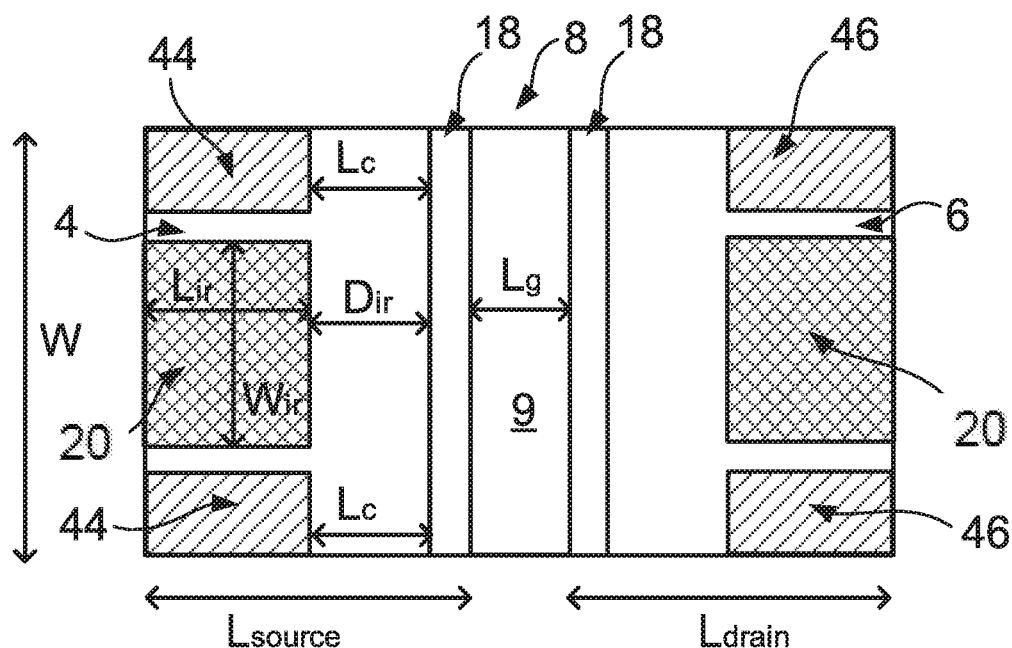
FIG. 8 shows an example of a semiconductor switch device according to an embodiment of the present disclosure.

FIG. 8 shows a generalised layout of a device according to an embodiment of this disclosure. In this embodiment, the source region 4 and/or the drain region 6 may include multiple respective contacts 44, 46 and isolation region(s) 20 of the kind described herein. In FIG. 8, the following layout parameters and indicated:

$L_g$ is the gate length (not including the spacers 18),

W is the gate width, $L_c$ is the distance between the contacts 44, 46 and the gate 8 in the direction perpendicular to the elongate edges of the gate 8 (it is envisaged that the value of $L_c$ need not be the same for the source contacts 44 and the drain contacts 46), $D_{ir}$ is the distance between the isolation region(s) and the gate 8 in the direction perpendicular to the elongate edges of the gate 8 (it is envisaged that the value of $D_{ir}$ need not be the same for the isolation regions 20 of the source and the drain), $L_{ir}$ and $W_{ir}$ are the dimensions of the isolation regions 20 in the directions perpendicular and parallel to the elongate edges of the gate 8, respectively, and $L_{source}$ and $L_{drain}$ are the lengths of the source and the drain in the direction perpendicular to the elongate edges of the gate 8.

By adjusting these parameters, the layout of the device may be chosen such that the value of $R_{A*B*}$ either approaches or even matches the one-dimensional counterpart $R_{AB}=\rho \cdot L/W$ described above.

In some embodiments, as shown in, for example, FIGS. 5 and 6, $L_c$ may be chosen to be less than or equal to $D_{ir}$, so that the contacts 44, 46 are closer to the gate 8 than the isolation regions 20, or at least are the same distance away from the gate 8. This arrangement may allow the isolation regions 20 to be provided without obstructing current flow between the contacts 44, 46 and the gate 8, ensuring that the current spreading effect described above may act to reduce the on state resistance of the device.

In some embodiments, $L_c$ may be chosen to be less than $D_{ir}$, so that the contacts 44, 46 are closer to the gate 8 than the isolation regions 20. In such embodiments, $W_{ir}$ may be chosen to match the spacing D between neighbouring contacts (e.g. as per FIGS. 5 and 6) so that the isolation region(s) 20 extend from an edge of a first of the contacts 44, 46 to an opposing edge of a second of the contacts 44, 46 when viewed from above the major surface 10. This may allow the area of the isolation region(s) 20 to be maximised for increasing the reduction in parasitic junction capacitance. Since the edges of the isolation region(s) 20 closest the gate 8 are set back from the gate 8 with respect to the contacts 44, 46, the isolation region(s) 20 may extend all the way between the neighbouring contacts 44, 46 without interfering with the current spreading effect.

In other embodiments, $W_{ir}$ may be chosen so that the width of the isolation region(s) 20 in a direction substantially parallel the elongate edges of the gate 8 is less than the spacing D between the contacts in the same direction. By making the isolation regions 20 narrower than the spaces between the neighbouring contacts 44, 46, further areas may be provided for the current spreading effect.

Figure 9:
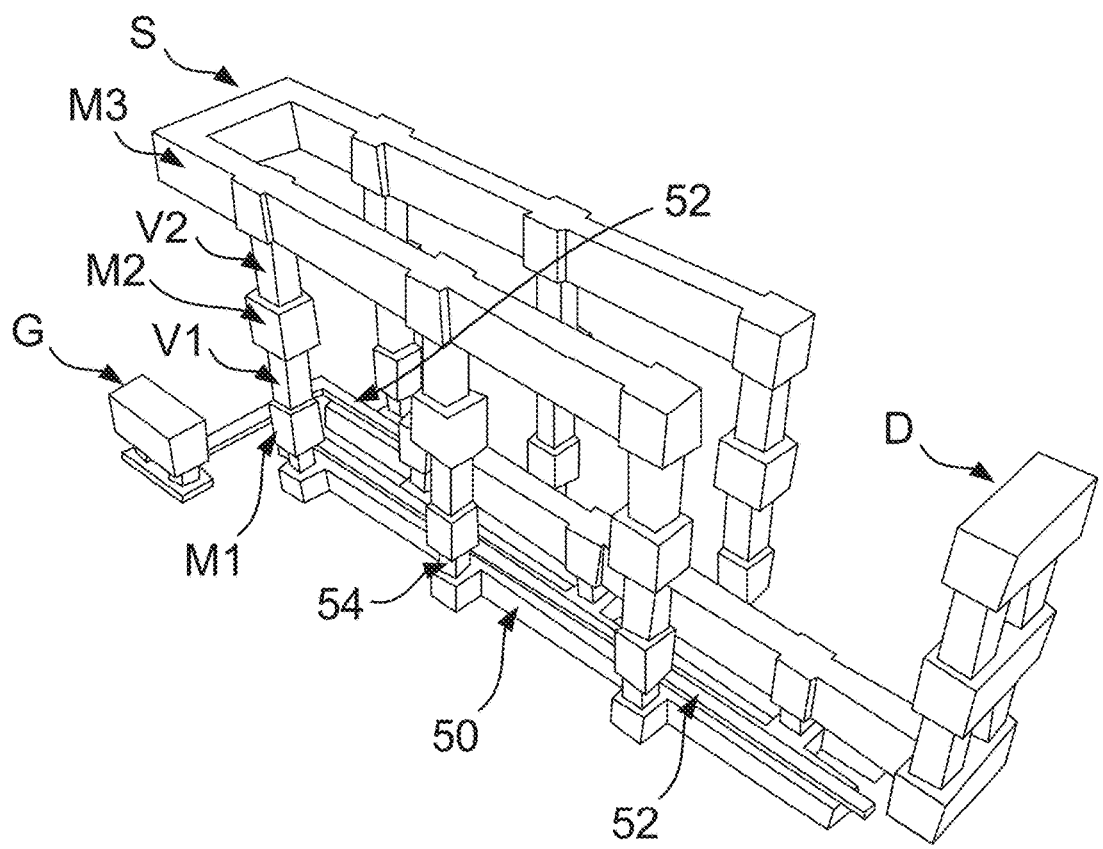
FIG. 9 shows a schematic three dimensional view of an example of a semiconductor switch device according to an embodiment of the present disclosure.
Figure 10:
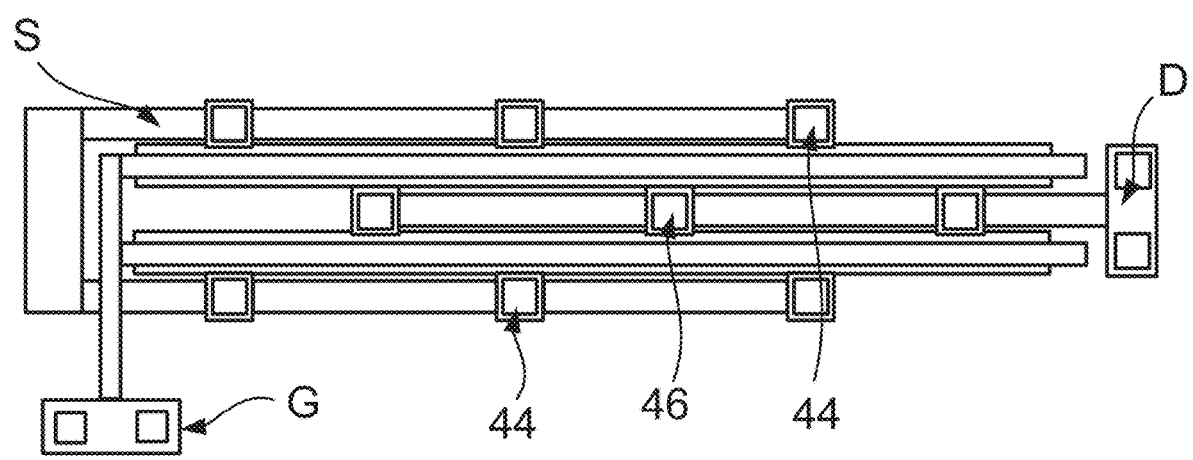
FIG. 10 shows a plan view of the device of FIG. 9.

FIG. 9 shows a schematic three dimensional view of an example of a semiconductor switch device according to an embodiment of the present disclosure. FIG. 10 shows a plan view of the layout of the device of FIG. 9.

In this embodiment, the device includes a single drain finger and two source fingers. The gate includes two interconnected polysilicon fingers 52 which extend between the drain finger and the respective source fingers. As can be seen in FIG. 9, the device may be implemented in a number of layers. The active region 50 of the device is located in a lower layer (corresponding to the first semiconductor region 2 described above) and incorporates the source region 4, drain region 6 and channel region of the device. FIGS. 9 and 10 also show the source contacts 44 and drain contacts 46. Note that the areas between the source contacts 44 in the active region 50, and also the areas between the drain contacts 46 in the active region 50 are shown as being empty in FIG. 9—these empty regions located in the layer containing the active region 50 correspond to the locations of the isolation regions 20 in this example.

In the present embodiment, the spacing between adjacent source contacts 44 on the source regions and adjacent drain contacts 46 in the drain region is substantially the same. Note that the source contacts 44 and drain contacts 46 are offset (this is most clearly shown in FIG. 10). In this example, the offset is equally to half the spacing between the source contacts, although other offset amounts are envisaged. Offsetting the contacts in this way can allow the backend parasitic capacitance between the electrical connections to these contacts to be reduced.

In other embodiments, the spacing between adjacent contacts 44 on the source region may be different to the spacing between adjacent drain contacts 46 on the drain region. Again, this can allow the backend parasitic capacitance between the electrical connections to these contacts to be reduced.

In other embodiments, the size of the isolation regions and the contacts 44, 46 on either the source and/or drain regions may be different. For instance, it is envisaged that different sized contacts 44 and/or isolation regions 20 may be used in the source region. It is also envisaged that different sized contacts 46 and/or isolation regions 20 may be used in the drain region. It is further envisaged that the contacts 44 and/or isolation regions 20 used in the source region may be of a different size (or sizes) to the contacts 46 and/or isolation regions 20 used in the drain region.

Above the source contacts 44 and drain contacts 46 there may be located a metallisation stack. In this embodiment, the metallisation stack includes three metal layers M1, M2, M3 and two via layers V1, V2 which are located in between the adjacent metal layers in the order M1, V1, M2, V2, M3. The source contacts are interconnected in metal layer M3. The drain contacts are interconnected in a different metal layer, namely metal layer M1. A gate terminal, connected to the polysilicon fingers 52 is, in the present embodiment, also implemented in metal layer M1.

Figure 11:
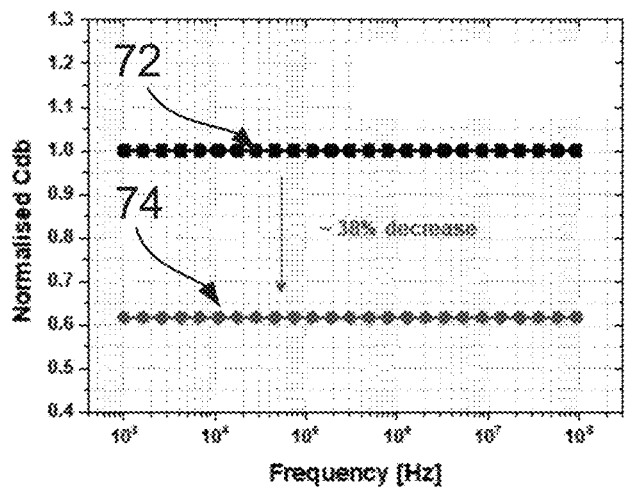
FIG. 11 shows a comparison of the simulated drain-to-bulk parasitic junction capacitance (Cdb=Csb) as a function of frequency, in the low-frequency limit, of a device according to an embodiment of this disclosure with a device not including any isolation regions of the kind described herein.
Figure 12:
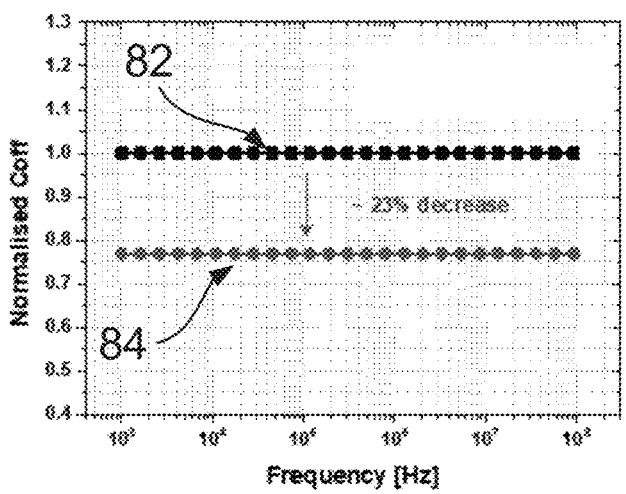
FIG. 12 shows a comparison of the simulated off-state capacitance (Coff) as a function of frequency, in the low-frequency limit, of a device according to an embodiment of this disclosure with a device not including any isolation regions of the kind described herein.
Figure 13:
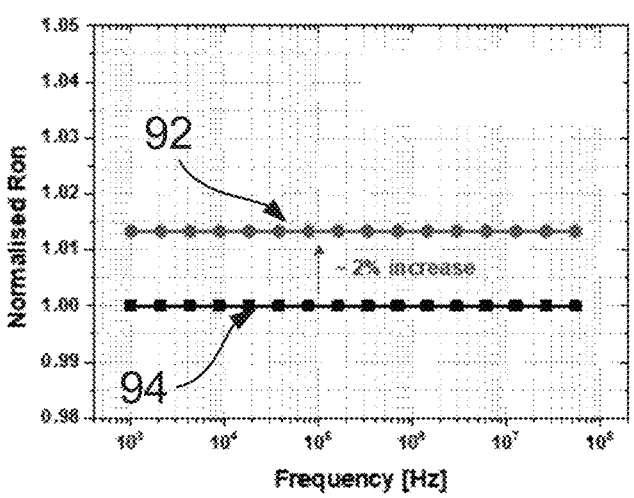
FIG. 13 shows a comparison of the simulated on-state resistance (Ron) as a function of frequency, in the low-frequency limit, of a device according to an embodiment of this disclosure with a device not including any isolation regions of the kind described herein.

FIGS. 11 to 13 demonstrate the ability embodiments of this disclosure to reduce the parasitic junction capacitances $C_{db}$, $C_{sb}$ and hence the off-state capacitance $C_{off}$ of a semiconductor switch device, without adversely affecting the on-state resistance $R_{on}$ of the device. In FIGS. 11 to 13, a device of the kind shown in FIG. 8 (with $L_c < D_{ir}$, and $W_{ir} < D$ (i.e. D is the spacing between adjacent contacts)) is compared with a similar device also having multiple contacts but without isolation regions in between the contacts. Each device had multiple contacts both in the drain region and in the source region.

FIG. 11 shows a comparison of the simulated drain-to-bulk parasitic junction capacitance $C_{db}$ as a function of frequency, in the low-frequency limit, of a device according to an embodiment of this disclosure (plot 72) with a device not including any isolation regions of the kind described herein (plot 74). As can be seen, a 38% reduction in $C_{db}$ was determined.

FIG. 12 shows a comparison of the simulated off-state capacitance ($C_{off}$) as a function of frequency, in the low-frequency limit, of a device according to an embodiment of this disclosure (plot 82) with a device not including any isolation regions of the kind described herein (plot 84). Consistent with the reduction in $C_{db}$ shown in FIG. 11, a 23% reduction in $C_{off}$ was determined.

FIG. 13 shows a comparison of the simulated on-state resistance ($R_{on}$) as a function of frequency, in the low-frequency limit, of a device according to an embodiment of this disclosure (plot 92) with a device not including any isolation regions of the kind described herein (plot 94). As can be seen, only a relatively small increase in $R_{on}$ was determined, which may be attributed to the inclusion of the isolation regions. Accordingly, a relatively large decrease in $C_{db}$ and $C_{off}$ is demonstrated to be achieved at the cost of only a relatively small increase in $R_{on}$.

Accordingly, there has been described a semiconductor switch device and a method of making the same. The device includes a semiconductor substrate having a major surface. The device also includes a first semiconductor region located in the substrate beneath the major surface. The device further includes an elongate gate located on the major surface. The device also includes a source region and a drain region located in the first semiconductor region adjacent respective first and second elongate edges of the gate. The device also includes electrical contacts for the source and drain regions. The contacts include at least two contacts located on either the source region or the drain region, which are spaced apart along a direction substantially parallel the elongate edges of the gate. The device further includes an isolation region located between the at least two contacts. The isolation region extends through the source/drain region from the major surface to the first semiconductor region.

Although particular embodiments of this disclosure have been described, it will be appreciated that many modifications/additions and/or substitutions may be made within the scope of the claims.

The invention claimed is:

1. A semiconductor switch device comprising:
    a semiconductor substrate having a major surface;
    a first semiconductor region located in the substrate beneath the major surface, the first semiconductor region having a first conductivity type;
    an elongate gate located on the major surface;
    a source region having a second conductivity type,
        wherein the source region is located in the first semiconductor region adjacent a first elongate edge of the gate;
    a drain region having the second conductivity type,
        wherein the drain region is located in the first semiconductor region adjacent a second elongate edge of the gate;
    electrical contacts for forming electrical connections to the source region and the drain region,
        wherein the electrical contacts include at least two contacts located on either the source region or the drain region,
        wherein said at least two contacts are spaced apart along a direction substantially parallel the elongate edges of the gate, and
    an isolation region located between said at least two contacts when viewed from above the major surface of the substrate,
        wherein the isolation region extends through the source/drain region from the major surface to the first semiconductor region;
        wherein an edge of each contact located closest the gate is located a distance $L_c$ from the gate; and
        wherein an edge of the isolation region located closest the gate is located a distance $D_{ir}$ from the gate, and wherein $L_c \leq D_{ir}$.

2. The device of claim 1,
wherein $L_c < D_{ir}$ and
wherein a dimension $W_{ir}$ of the isolation region in a direction substantially parallel the elongate edges of the gate is substantially equal to the spacing between the contacts in the same direction, so that the isolation region extends from an edge of a first of the contacts to an opposing edge of a second of the contacts when viewed from above the major surface.

3. The device of claim 1,
wherein a dimension $W_{ir}$ of the isolation region in a direction substantially parallel the elongate edges of the gate is less than the spacing between the contacts in the same direction.

4. The device of claim 1
comprising at least three said contacts located on the source region and/or at least three said contacts located on the drain region, and
wherein a said isolation region is located between each pair of neighbouring contacts of the source region and/or of the drain region.

5. The device of claim 1
further comprising at least one isolation region located at an end of a row of said contacts in the source/drain region,
wherein the isolation region extends through the source/drain region from the major surface to the first semiconductor region.

6. The device of claim 1,
wherein the electrical contacts include at least two contacts located on the source region and at least two contacts located on the drain region,
wherein the at least two contacts on the source region are spaced apart along a direction substantially parallel the elongate edges of the gate,
wherein the at least two contacts on the drain region are spaced apart along a direction substantially parallel the elongate edges of the gate,
wherein the device comprises an isolation region located between said at least two contacts on the source region when viewed from above the major surface of the substrate,
wherein the device comprises an isolation region located between said at least two contacts on the drain region when viewed from above the major surface of the substrate, and
wherein each isolation region extends through the source/drain region from the major surface to the first semiconductor region.

7. The device of claim 6,
wherein the spacing between the contacts on the source region is substantially equal to the spacing between the contacts on the drain region, and
wherein the contacts on the drain region are offset with respect to the contacts on the source region in a direction parallel to the elongate edges of the gate,
wherein the offset is substantially equal to half the spacing between the contacts on the source region.

8. The device of claim 6,
wherein the spacing between the contacts on the source region is different to the spacing between the contacts on the drain region.

9. The device of claim 1
comprising a plurality of said source and/or drain regions arranged as a plurality of inter-digitated fingers.

10. The device of claim 1,
wherein the or each isolation region extends to a greater depth beneath the major surface of the substrate than the source/drain region in which that isolation region is located.

11. The device of claim 1,
wherein the or each isolation region comprises a trench filled with dielectric material.

12. The device of claim 1,
wherein the first conductivity type is p-type and wherein the second conductivity type is n-type.

13. The device of claim 1,
wherein the device is a Radio Frequency (RF) switch device.

14. A method of making a semiconductor switch device, the method comprising:
providing a semiconductor substrate having a major surface and a first semiconductor region located in the substrate beneath the major surface, the first semiconductor region having a first conductivity type;
depositing and patterning a gate dielectric and a gate electrode material to form an elongate gate on the major surface;
forming a source region having a second conductivity type,
wherein the source region is located in the first semiconductor region adjacent a first elongate edge of the gate;
forming a drain region having the second conductivity type,
wherein the drain region is located in the first semiconductor region adjacent a second elongate edge of the gate;
forming an isolation region that extends through the source or the drain region from the major surface to the first semiconductor region, and
depositing electrical contacts for forming electrical connections to the source region and the drain region,
wherein the electrical contacts include at least two contacts located on either the source region or the drain region,
wherein said at least two contacts are spaced apart along a direction substantially parallel the elongate edges of the gate,
wherein the isolation region is located between said at least two contacts when viewed from above the major surface of the substrate;
wherein an edge of each contact located closest the gate is located a distance $L_c$ from the gate; and
wherein an edge of the isolation region located closest the gate is located a distance $D_{ir}$ from the gate, and wherein $L_c \leq D_{ir}$.

15. A semiconductor switch device comprising:
a semiconductor substrate having a major surface;
a first semiconductor region located in the substrate beneath the major surface, the first semiconductor region having a first conductivity type;
an elongate gate located on the major surface;
a source region having a second conductivity type,
wherein the source region is located in the first semiconductor region adjacent a first elongate edge of the gate;
a drain region having the second conductivity type,
wherein the drain region is located in the first semiconductor region adjacent a second elongate edge of the gate;
electrical contacts for forming electrical connections to the source region and the drain region, wherein the electrical contacts include at least two contacts located on either the source region or the drain region, wherein said at least two contacts are spaced apart along a direction substantially parallel the elongate edges of the gate, and an isolation region located between said at least two contacts when viewed from above the major surface of the substrate, wherein the isolation region extends through the source/drain region from the major surface to the first semiconductor region;

wherein the electrical contacts include at least two contacts located on the source region and at least two contacts located on the drain region, wherein the at least two contacts on the source region are spaced apart along a direction substantially parallel the elongate edges of the gate, wherein the at least two contacts on the drain region are spaced apart along a direction substantially parallel the elongate edges of the gate, wherein the device comprises an isolation region located between said at least two contacts on the source region when viewed from above the major surface of the substrate, wherein the device comprises an isolation region located between said at least two contacts on the drain region when viewed from above the major surface of the substrate, and wherein each isolation region extends through the source/drain region from the major surface to the first semiconductor region.

16. The device of claim 15, wherein the spacing between the contacts on the source region is substantially equal to the spacing between the contacts on the drain region, and wherein the contacts on the drain region are offset with respect to the contacts on the source region in a direction parallel to the elongate edges of the gate, wherein the offset is substantially equal to half the spacing between the contacts on the source region.

17. The device of claim 15, wherein the spacing between the contacts on the source region is different to the spacing between the contacts on the drain region.

\* \* \* \* \*